(12) United States Patent
Kaneko et al.

(10) Patent No.: US 8,388,149 B2
(45) Date of Patent: Mar. 5, 2013

(54) PROJECTOR WITH SUPER LUMINESCENT DIODE

(75) Inventors: Tsuyoshi Kaneko, Shimosuwa (JP); Takashi Takeda, Suwa (JP)

(73) Assignee: Seiko Epson Corporation (JP)

(*) Notice: Subject to any disclaimer, the term of this patent is extended or adjusted under 35 U.S.C. 154(b) by 254 days.

(21) Appl. No.: 12/876,437

(22) Filed: Sep. 7, 2010

(65) Prior Publication Data

US 2011/0063585 A1 Mar. 17, 2011

(30) Foreign Application Priority Data

Sep. 11, 2009 (JP) ................................. 2009-210579

(51) Int. Cl.
*G03B 21/28* (2006.01)
*H01J 5/16* (2006.01)
*H01L 33/00* (2010.01)
*H01S 3/08* (2006.01)
*F21V 7/04* (2006.01)

(52) U.S. Cl. ............ 353/99; 353/31; 313/512; 313/113; 257/99; 257/95; 257/98; 372/99; 362/609; 362/612; 362/623

(58) Field of Classification Search .................... 353/99, 353/31; 313/512, 113; 257/99, 95, 98; 372/99; 362/609, 612, 623

See application file for complete search history.

(56) References Cited

U.S. PATENT DOCUMENTS

| | | | | |
|---|---|---|---|---|
| 5,498,883 A * | 3/1996 | Lebby et al. | ................... | 257/95 |
| 5,606,181 A | 2/1997 | Sakuma et al. | | |
| 6,339,606 B1 * | 1/2002 | Alphonse | ................... | 372/50.1 |
| 7,192,164 B2 * | 3/2007 | Matsuura | ................ | 362/296.05 |
| 7,525,127 B2 | 4/2009 | Hattori et al. | | |
| 2004/0070337 A1 | 4/2004 | Goh et al. | | |
| 2010/0302775 A1 * | 12/2010 | Hata | ............................ | 362/231 |

FOREIGN PATENT DOCUMENTS

| | | |
|---|---|---|
| CN | 1885581 | 12/2006 |
| EP | 0582078 | 2/1994 |
| JP | 53-126286 | 11/1978 |
| JP | 06-104483 | 4/1994 |
| JP | 2002-518857 | 6/2002 |
| JP | 2007-273690 | 10/2007 |
| JP | 2009-238847 | 10/2009 |
| WO | WO 99/66613 | 12/1999 |
| WO | WO 01/63331 | 8/2001 |

* cited by examiner

*Primary Examiner* — Georgia Y Epps
*Assistant Examiner* — Magda Cruz
(74) *Attorney, Agent, or Firm* — Harness, Dickey & Pierce, P.L.C.

(57) ABSTRACT

A projector includes: a light emitting device; a light modulation device adapted to modulate a light beam emitted from the light emitting device; and a projection device adapted to project the image formed by the light modulation device, wherein the light emitting device includes a light emitting element formed of a super luminescent diode, and adapted to emit light, and a base supporting the light emitting element with first and second reflecting surfaces to reflect the light emitted from the light emitting element. The light emitting element emits the light from first and second end surfaces. Directions of first and second outgoing light respectively emitted from the first and second end surfaces are opposite to each other. Directions of the first and second reflected light respectively reflected by the first and second reflecting surfaces are the same as each other.

8 Claims, 14 Drawing Sheets

PROJECTOR WITH SUPER LUMINESCENT DIODE

BACKGROUND

1. Technical Field

The present invention relates to a projector.

2. Related Art

A super luminescent diode (hereinafter also referred to as an "SLD") is a semiconductor element capable of providing an output up to several tens of mW in the light output characteristic similarly to a semiconductor laser while showing an incoherent property and a wideband spectrum shape similarly to an ordinary light emitting diode. Similarly to a semiconductor laser, the SLD uses a mechanism in which the spontaneous-emission light generated by the recombination of the injected carriers is amplified in accordance with a high gain due to the stimulated emission while proceeding toward a light emitting end surface, and then emitted from the light emitting end surface. It should be noted that unlike the semiconductor laser the SLD requires to prevent formation of the resonator due to the end surface reflection, thereby preventing the laser oscillation from occurring.

As a measure for preventing the laser oscillation, there has been known a configuration of tilting the gain region (optical waveguide) with respect to the emission end surface as shown in, for example, JP-A-2007-273690.

As described above, in the light emitting element provided with a linear gain region (optical waveguide) tilted with respect to the emission end surface, the light emitted from one of the two emission end surfaces of the gain region and the light emitted from the other thereof might proceed in respective directions different from each other in some cases. However, if the SLD is used as a light source of a projector, it is preferable that the light beams emitted from the SLD proceed in the same direction. According to such an SLD, it is possible to make the light axis adjustment in the projector easier.

SUMMARY

An advantage of some aspects of the invention is to provide a projector, which is provided with a light emitting device for making the light beams emitted from a light emitting element proceed in the same direction, and is easy in adjusting the light axis.

According to an aspect of the invention, there is provided a projector including a light emitting device, a light modulation device adapted to modulate a light beam emitted from the light emitting device in accordance with image information, and a projection device adapted to project the image formed by the light modulation device, wherein the light emitting device includes a light emitting element formed of a super luminescent diode, and adapted to emit light when flowing current through an active layer sandwiched between a first cladding layer and a second cladding layer, and a base supporting the light emitting element, and provided with a first reflecting surface and a second reflecting surface each adapted to reflect the light emitted from the light emitting element, the light emitting element has a configuration of emitting the light from a first end surface and a second end surface, a direction of first outgoing light emitted from the first end surface of the light emitting element and a direction of second outgoing light emitted from the second end surface of the light emitting element are opposite to each other, the first reflecting surface reflects the first outgoing light, the second reflecting surface reflects the second outgoing light, and a direction of the first reflected light reflected by the first reflecting surface and a direction of the second reflected light reflected by the second reflecting surface are the same as each other.

According to such a projector as described above, the light emitting device making the light emitted from the light emitting element proceed in the same direction is provided, and it becomes possible to make the light axis adjustment easier.

In the projector of the above aspect of the invention, it is also possible that the base has a recessed section provided to a surface thereof, the recessed section has at least two tilted surfaces tilted 45 degrees with respect to a horizontal direction of the surface of the base, the light emitting element is disposed so that the light is emitted in parallel to the horizontal direction of the surface of the base, one of the two tilted surfaces is provided with the first reflecting surface, and the other of the two tilted surfaces is provided with the second reflecting surface.

According to such a projector as described above, the light emitting device making the light emitted from the light emitting element proceed in the same direction is provided, and it becomes possible to make the light axis adjustment easier.

In the projector of the above aspect of the invention, it is also possible that the base has a recessed section provided to a surface thereof, the recessed section has a first concave surface and a second concave surface each having a concave shape, the first concave surface is provided with the first reflecting surface, and the second concave surface is provided with the second reflecting surface.

According to such a projector as described above, the light emitting device making the light emitted from the light emitting element proceed in the same direction is provided, and it becomes possible to make the light axis adjustment easier.

In the projector of the above aspect of the invention, it is also possible that the first concave surface and the second concave surface are each a paraboloidal surface, the first end surface is located at a focal position of the first concave surface, and the second end surface is located at a focal position of the second concave surface.

According to such a projector as described above, there is provided the light emitting device making the light emitted from the light emitting element proceed in the same direction, and capable of converting the light into parallel light, and it becomes possible to improve the light efficiency.

In the projector of the above aspect of the invention, it is also possible that a lid made of a material permeable to the first reflected light and the second reflected light is further included, and the light emitting element is encapsulated with the lid.

According to such a projector as described above, improvement in reliability of the light emitting device can be achieved, and the absorption loss of the first reflected light and the second reflected light in the lid can be reduced.

In the projector of the above aspect of the invention, it is also possible that a thermal conductivity of the base is higher than a thermal conductivity of the light emitting element.

According to such a projector as described above, since the base can function as a heat sink, the light emitting device can have high heat radiation performance.

In the projector of the above aspect of the invention, it is also possible that the active layer is disposed on the base side in the light emitting element.

According to such a projector as described above, the light emitting device can have high heat radiation performance.

In the projector of the above aspect of the invention, it is also possible that the active layer is disposed on a side opposite to the base side in the light emitting element, the light emitting element further includes a substrate provided with the active layer sandwiched between the first cladding layer and the second cladding layer, and the substrate is disposed between the active layer and the base.

According to such a projector as described above, since the substrate is disposed between the active layer and the base, the active layer is disposed at the position at least by the thickness of the substrate further from the base. Therefore, the outgoing light with a more preferable shape (cross-sectional shape) can be obtained.

BRIEF DESCRIPTION OF THE DRAWINGS

The invention will be described with reference to the accompanying drawings, wherein like numbers reference like elements.

DESCRIPTION OF AN EXEMPLARY EMBODIMENT

An exemplary embodiment of the invention will hereinafter be described with reference to the accompanying drawings.

1. Projector

Figure 1:
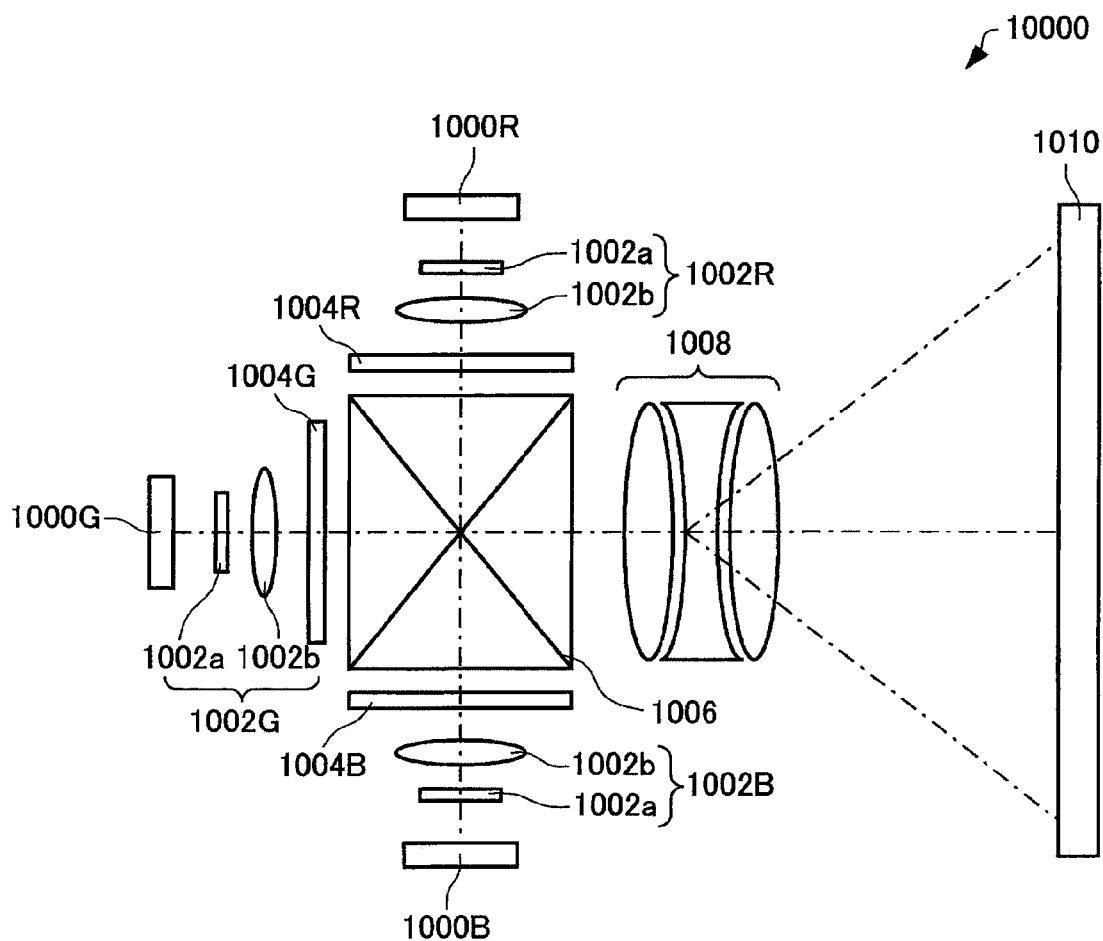
FIG. 1 is a diagram schematically showing a projector according to an embodiment of the invention.

Firstly, a projector 10000 according to the present embodiment will be explained with reference to the accompanying drawings. FIG. 1 is a diagram schematically showing the projector 10000. It should be noted that in FIG. 1, a housing for constituting the projector 10000 is omitted for the sake of convenience. The projector 10000 includes a light emitting device according to the invention. Hereinafter, an example of using a light emitting device 1000 as the light emitting device according to the invention will be explained.

In the projector 10000, a red light source (light emitting device) 1000R, a green light source (light emitting device) 1000G, and a blue light source (light emitting device) 1000B for emitting a red light beam, a green light beam, and a blue light beam, respectively, each correspond to the light emitting device 1000 described above.

The projector 10000 is provided with transmissive liquid crystal light valves (light modulation devices) 1004R, 1004G, and 1004B for modulating the light beams emitted from the light sources 1000R, 1000G, and 1000B, respectively, in accordance with image information, and a projection lens (projection device) 1008 for magnifying the images respectively formed by the liquid crystal light valves 1004R, 1004G, and 1004B and then projecting the images thus magnified on a screen (display surface) 1010. Further, the projector 10000 is provided with a cross dichroic prism (a colored light combining section) 1006 for combining the light beams emitted from the liquid crystal light valves 1004R, 1004G, and 1004B and then guiding the combined light beam to the projection lens 1008.

Further, in order for equalizing the illumination distribution of the light beams emitted from the light sources 1000R, 1000G, and 1000B, the projector 10000 is provided with equalizing optical systems 1002R, 1002G, and 1002B disposed downstream of the light sources 1000R, 1000G, and 1000B, respectively, along the optical paths, and illuminates the liquid crystal light valves 1004R, 1004G, and 1004B with the light beams having the illumination distribution equalized by the equalizing optical systems 1002R, 1002G, and 1002B. The equalizing optical systems 1002R, 1002G, and 1002B are each composed of, for example, a hologram 1002a and a field lens 1002b.

The three colored light beams modulated by the respective liquid crystal light valves 1004R, 1004G, and 1004B enter the cross dichroic prism 1006. This prism is formed by bonding four rectangular prisms, and is provided with a dielectric multilayer film for reflecting the red light beam and a dielectric multilayer film for reflecting the blue light beam disposed on the inside surfaces so as to form a crisscross. The three colored light beams are combined by these dielectric multilayer films to form a light beam representing a color image. Further, the light beam obtained by combining the three colored light beams is projected on the screen 1010 by the projection lens 1006 as the projection optical system, thus an enlarged image is displayed.

It should be noted that although the transmissive liquid crystal light valves are used as the light modulation devices in the example described above, it is also possible to use light valves other than the liquid crystal light valves, or to use reflective light valves. As such light valves, reflective liquid crystal light valves, digital micromirror devices, for example, can be cited. Further, the configuration of the projection optical system is appropriately modified in accordance with the type of the light valves used therein.

Further, by scanning the light from the light emitting device 1000 on the screen, it is possible to apply the light emitting device 1000 also to the light emitting device (the light source device) of a scanning type image display device (a projector) having a scanning section as an image forming device for displaying an image with a desired size on the display surface.

According to the projector 10000, since the light emitting devices according to the invention can be used as the light sources, the light axis adjustment becomes easy. The configuration and so on of the light emitting device used for the projector 10000 will hereinafter be explained.

2. Light Emitting Element

Figure 2:
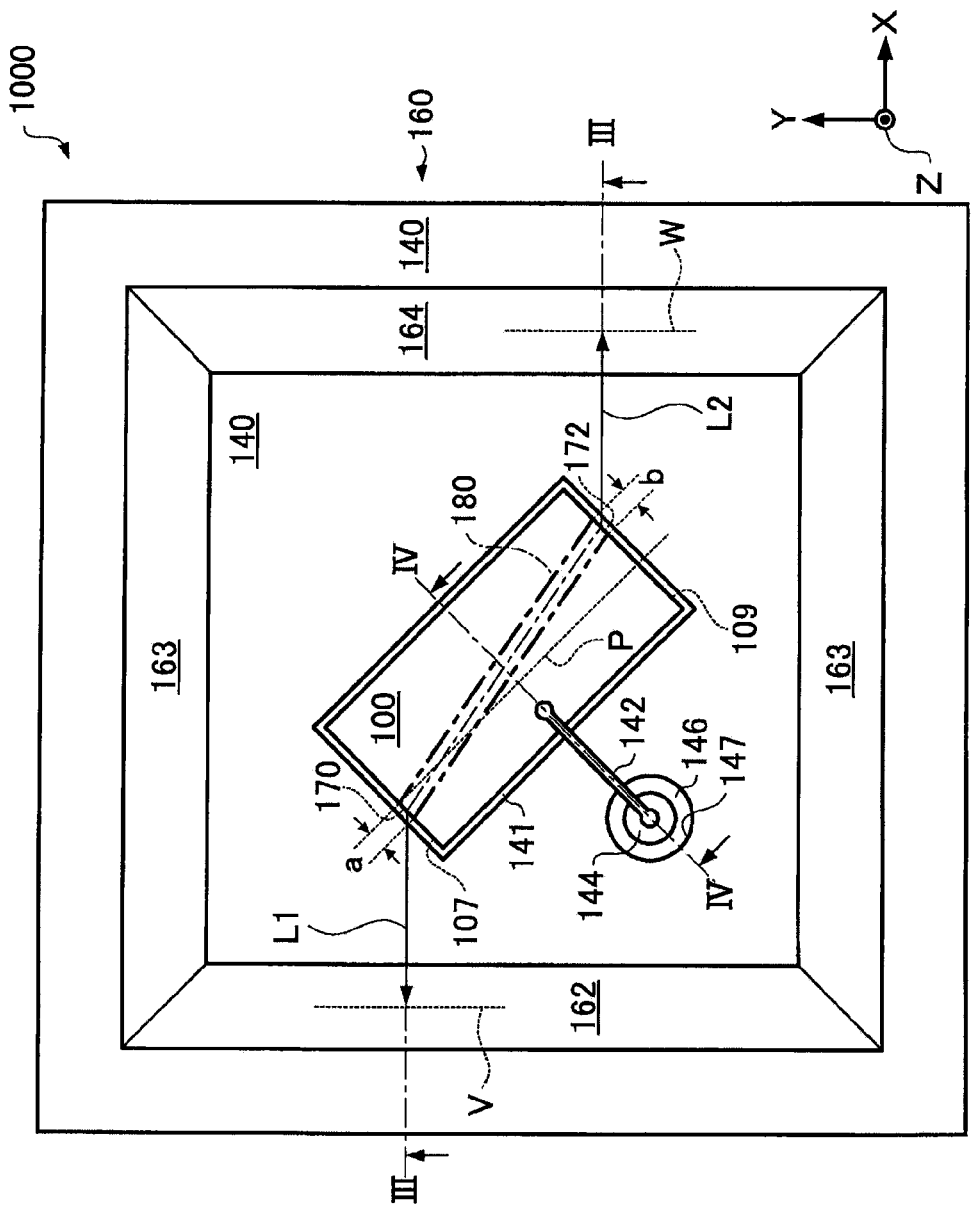
FIG. 2 is a plan view schematically showing a light emitting device of the projector according to the present embodiment.
Figure 3:
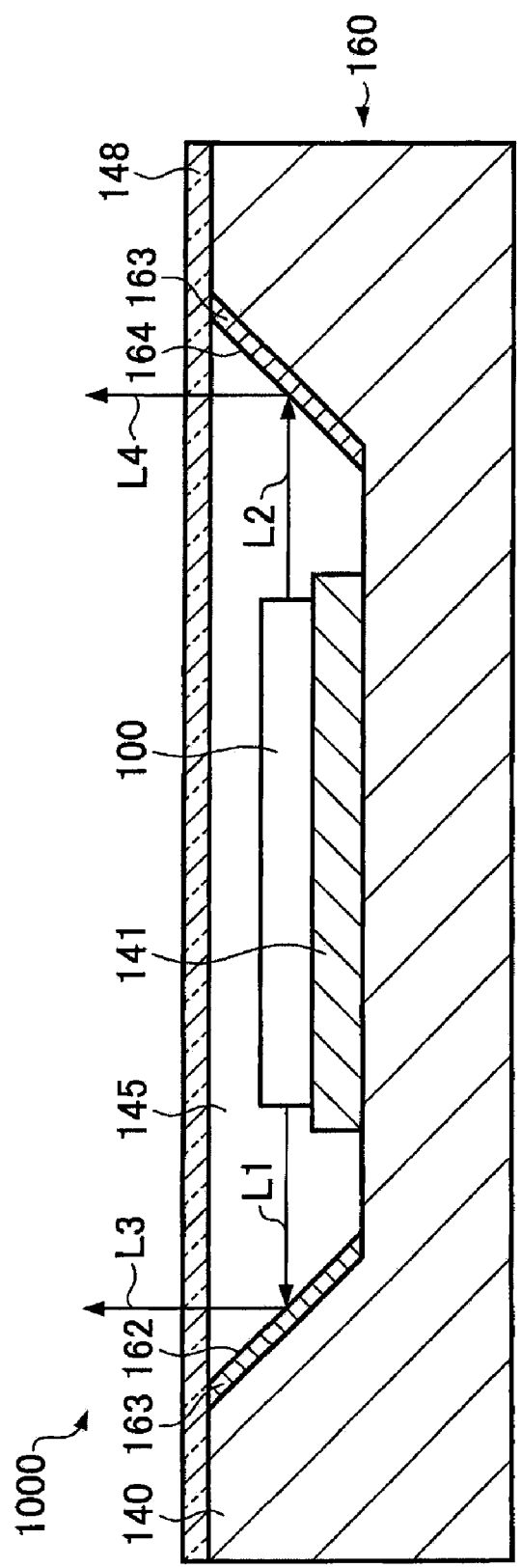
FIG. 3 is a cross-sectional view schematically showing the light emitting device of the projector according to the present embodiment.
Figure 4:
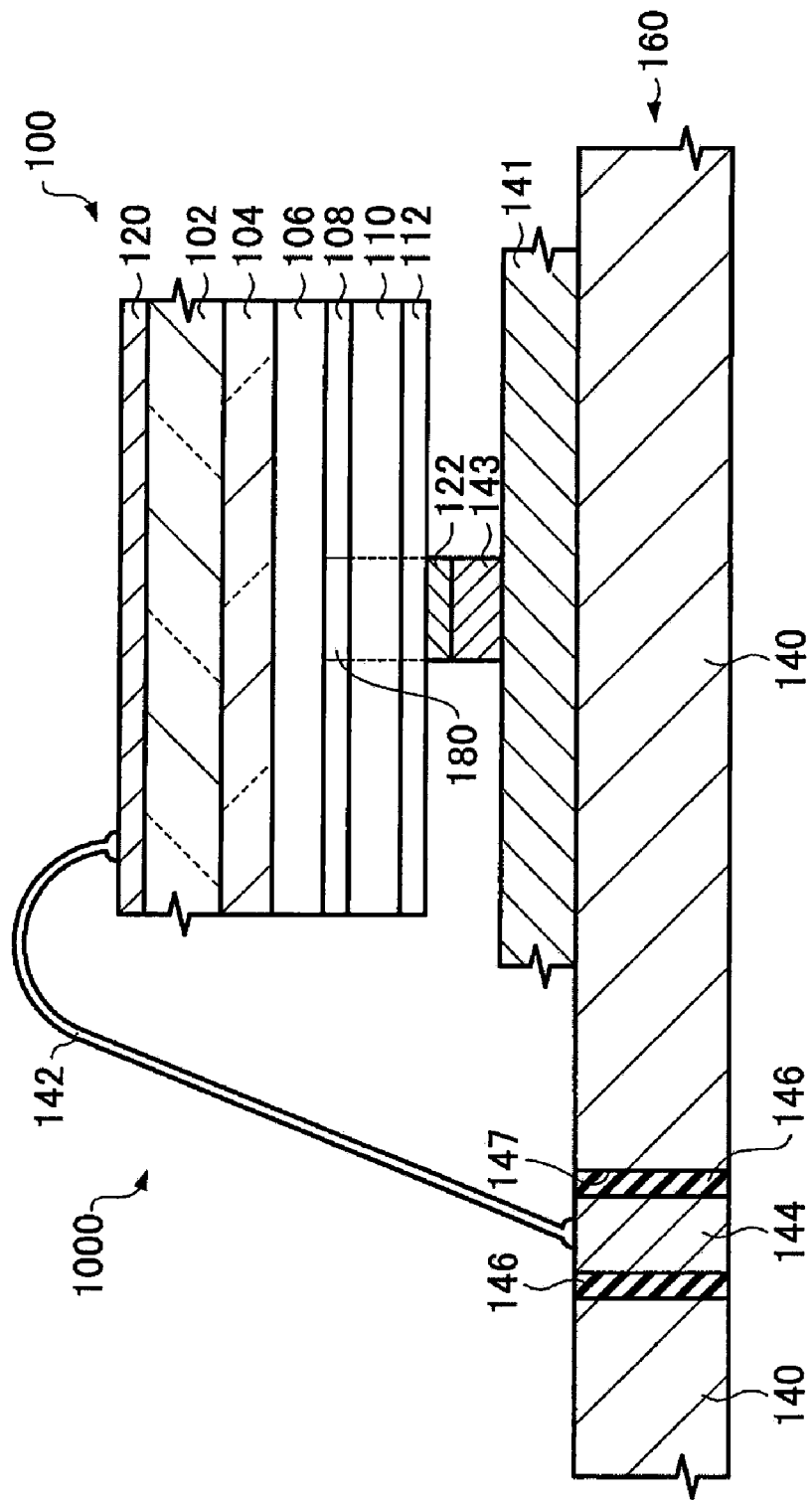
FIG. 4 is a cross-sectional view schematically showing the light emitting device of the projector according to the present embodiment.

Then, the light emitting device 1000 used for the projector 10000 according to the present embodiment will be explained with reference to the accompanying drawings. FIG. 2 is a plan view schematically showing the light emitting device 1000, FIG. 3 is a cross-sectional view along the line III-III shown in FIG. 2, and FIG. 4 is a cross-sectional view along the line IV-IV shown in FIG. 2. It should be noted that in FIGS. 2 and 4, a lid 148 is omitted from illustration for the sake of convenience. Further, in FIG. 3 the light emitting element 100 is shown in a simplified manner for the sake of convenience.

As shown in FIGS. 2 through 4, the light emitting device 1000 can include a package 160, the light emitting element 100, a sub-mount 141, an insulating member 146, a terminal 144, a first connection member 142, and a second connection member 143. It should be noted that the case in which the light emitting element 100 is an InGaAlP type (red) SLD will be explained here. Unlike the semiconductor laser, in the SLD the laser oscillation can be prevented by preventing formation of the resonator due to the end surface reflection. Therefore, the speckle noise can be reduced.

The light emitting element 100 is mounted on a base 140. In the example shown in the drawing, the light emitting element 100 is mounted on the base 140 via the sub-mount 141. It can be said that the light emitting element 100 is mounted to the package 160. As shown in FIGS. 2 through 4, the light emitting element 100 has a cladding layer (hereinafter referred to as a "first cladding layer") 110, an active layer 108 formed thereon, and an other cladding layer (hereinafter referred to as a "second cladding layer") 106 formed thereon. The light emitting element 100 can further include, for example, a substrate 102, a buffer layer 104, a contact layer 112, an electrode (hereinafter referred to as a "first electrode") 122, and an electrode (hereinafter referred to as a "second electrode") 120.

As the substrate 102, a first conductivity type (e.g., an n-type) GaAs substrate, for example, can be used.

As shown in, for example, FIG. 4, the buffer layer 104 can be formed under the substrate 102. The buffer layer 104 can improve the crystallinity of a layer to be formed above the buffer layer 104 in, for example, the epitaxial growth process described later (see FIG. 5). As the buffer layer 104, it is possible to use, for example, a GaAs layer or an InGaP layer of the first conductivity type (n-type) having crystallinity much preferable (e.g., having the defect density lower than that of the substrate 102) to that of the substrate 102.

The second cladding layer 106 is formed under the buffer layer 104. The second cladding layer 106 is formed of, for example, a semiconductor of the first conductivity type. As the second cladding layer 106, an n-type AlGaP layer, for example, can be used.

The active layer 108 is formed under the second cladding layer 106. The active layer 108 is disposed on the side of the base 140 in the light emitting element 100, for example. In other words, the active layer 108 is disposed, for example, on the lower side (the side opposite to the side of the substrate 102) of the midpoint in the thickness direction of the light emitting element 100. The active layer 108 has, for example, a multiple quantum well (MQW) structure having three quantum well structures stacked one another each composed of an InGaP well layer and an InGaAlP barrier layer.

A part of the active layer 108 forms a gain region 180 forming a current channel of the active layer 108. It is possible to generate light in the gain region 180, and the light can be provided with gains inside the gain region 180. The shape of the active layer 108 is, for example, a rectangular solid (including a cube). As shown in FIG. 2, the active layer 108 has a first side surface 107 and a second side surface 109. The first side surface 107 and the second side surface 109 are opposed to each other, and are, for example, parallel to each other. The active layer 108 sandwiched by the first cladding layer 110 and the second cladding layer 106 constitutes, for example, a stacked structure. The first side surface 107 and the second side surface 109 are the surfaces of the active layer 108 having no contact with the first cladding layer 110 or the second cladding layer 106, and can be regarded as exposed surfaces of the stacked structure. The stacked structure can further include the substrate 102, the buffer layer 104, and the contact layer 112.

The gain region 180 is disposed from the first side surface 107 to the second side surface 109 in a direction tilted with respect to the perpendicular P of the first side surface 107 in a plan view of the active layer 108 (see FIG. 2). Thus, the laser oscillation of the light generated in the gain region 180 can be suppressed or prevented. It should be noted that the case in which the gain region 180 is disposed in a certain direction denotes the case in which the direction is identical to a direction connecting the center of a first end surface 170 of the gain region 180 on the side of the first side surface 107 and the center of a second end surface 172 thereof on the side of the second side surface 109 in a plan view.

Further, as shown in FIG. 2, although the width "a" of the first end surface 170 of the gain region 180 is the same as the width "b" of the second end surface 172 in the example shown in the drawings, they can also be different from each other. The planar shape of the gain region 180 is, for example, a parallelogram shown in FIG. 2. Although not shown in the drawings, the planar shape of the gain region 180 can also be, for example, a curved shape or a combination of a straight shape and a curved shape.

The first cladding layer 110 is formed under the active layer 108. The first cladding layer 110 is made of, for example, a semiconductor of a second conductivity type (e.g., a p-type). As the first cladding layer 110, a p-type AlGaP layer, for example, can be used.

For example, a pin diode is composed of the p-type first cladding layer 110, the active layer 108 with no impurity doped, and the n-type second cladding layer 106. Each of the first cladding layer 110 and the second cladding layer 106 has a forbidden band width larger than that of the active layer 108 and a refractive index smaller than that of the active layer 108. The active layer 108 has a function of amplifying the light. The first cladding layer 110 and the second cladding layer 106 have a function of sandwiching the active layer 108 to thereby confine injected carriers (electrons and holes) and the light therein.

As shown in, for example, FIG. 4, the contact layer 112 can be formed under the first cladding layer 110. As the contact layer 112, a layer having ohmic contact with the first electrode 122 can be used. The contact layer 112 is made of, for example, a second conductivity type semiconductor. As the contact layer 112, a p-type GaAs layer, for example, can be used.

The first electrode 122 is formed under the contact layer 112. The first electrode 122 is electrically connected to the first cladding layer 110 via the contact layer 112. The first electrode 122 is one of the electrodes for driving the light emitting element 100. As the first electrode 122, what is obtained by stacking a Cr layer, an AuZn layer, and an Au layer in this order from the side of the contact layer 112, for example, can be used. The upper surface of the first electrode 122 has a planar shape substantially the same as that of the gain region 180. In the example shown in the drawing, the current channel between the electrodes 122, 120 is determined in accordance with the planar shape of the contact surface between the first electrode 122 and the contact layer 112, and as a result, the planar shape of the gain region 180 can be determined. It should be noted that although not shown in the drawings, it is also possible that the contact surface between the second electrode 120 and the substrate 102 has a planar shape the same as that of the gain region 180.

The second electrode 120 is formed on the entire upper surface of the substrate 102. The second electrode 120 can have contact with the layer (the substrate 102 in the example shown in the drawings) having ohmic contact with the second electrode 120. The second electrode 120 is electrically connected to the second cladding layer 106 via the substrate 102 and the buffer layer 104. The second electrode 120 is the other of the electrodes for driving the light emitting element 100. As the second electrode 120, what is obtained by stacking a Cr layer, an AuGe layer, an Ni layer, and an Au layer in this order from the side of the substrate 102, for example, can be used. It should be noted that it is also possible to dispose a second contact layer (not shown) between the second cladding layer 106 and the buffer layer 104, expose the second contact layer on the side of the second cladding layer 106 using a dry etching process or the like, and then dispose the second electrode 120 under the second contact layer. Thus, a single-sided electrode structure can be obtained. As the second contact layer, an n-type GaAs layer, for example, can be used. Further, although not shown in the drawings, the substrate 102 and the member disposed under the substrate 102 can be separated from each other using, for example, an epitaxial liftoff (ELO) method or a laser liftoff method. In other words, it is also possible for the light emitting element 100 not to include the substrate 102. In this case, the second electrode 120 can be formed directly on the buffer layer 104, for example.

In the light emitting element 100, when applying a forward bias voltage of the pin diode between the first electrode 122 and the second electrode 120, there occurs recombination of electrons and holes in the gain region 180 of the active layer 108. The recombination causes the light emission. The stimulated emission begins at the light thus generated in a chained manner, the light intensity is amplified while the light proceeds inside the gain region 180, and thus it becomes possible to emit the light from the first end surface 170 as first outgoing light L1, and from the second end surface 172 as second outgoing light L2. The first outgoing light L1 and the second outgoing light L2 can be emitted in a direction tilted with an angle larger than the tilt angle of the gain region 180 with respect to the perpendicular P of the first side surface 107 due to refraction of light. The proceeding direction of the first outgoing light L1 and the proceeding direction of the second outgoing light L2 are opposite to each other, for example.

As shown in FIGS. 2 and 3, the package 160 can include a first reflecting surface 162, a second reflecting surface 164, a reflecting section 163, a base 140, and a lid 148.

As shown in FIG. 3, the first reflecting surface 162 can reflect the first outgoing light L1 toward the upper side of the light emitting element 100. Similarly, the second reflecting surface 164 can reflect the second outgoing light L2 toward the upper side of the light emitting element 100. The first outgoing light L1 is reflected by the first reflecting surface 162, and can proceed in an upward direction perpendicular to the top surface of the active layer 108 (in a Z direction in FIG. 2), for example, as a first reflected light L3. The proceeding direction of the first outgoing light L1 and the proceeding direction of the first reflected light L3 make a right angle with each other, for example. Similarly, the second outgoing light L2 is reflected by the second reflecting surface 164, and can proceed in an upward direction perpendicular to the top surface of the active layer 108, for example, as a second reflected light L4. The proceeding direction of the second outgoing light L2 and the proceeding direction of the second reflected light L4 make a right angle with each other, for example. Further, in the example shown in the drawings, for example, the proceeding direction of the first reflected light L3 obtained by the first reflecting surface 162 and the proceeding direction of the second reflected light L4 obtained by the second reflecting surface 164 are the same. It is preferable that the reflectance of the first reflecting surface 162 with respect to the first outgoing light L1 is higher than 50%, and equal to or lower than 100%. Similarly, the reflectance of the second reflecting surface 164 with respect to the second outgoing light L2 is preferably higher than 50%, and equal to or lower than 100%.

As shown in FIG. 2, for example, the proceeding direction of the first outgoing light L1 makes a right angle with a nodal line V between a plane (an X-Y plane) parallel to the top surface of the active layer 108 and the first reflecting surface 162. Similarly, the proceeding direction of the second outgoing light L2 makes a right angle with a nodal line W between the plane parallel to the top surface of the active layer 108 and the second reflecting surface 164, for example.

The base 140 can support the light emitting element 100 indirectly via the sub-mount 141, for example. As the base 140, a plate-like (rectangular solid shaped) member provided with a recessed section 145 to a surface thereof can be used, for example. The side surfaces of the recessed section 145 can be tilted, for example, 45 degrees with respect to a horizontal direction (an X-Y direction in FIG. 2). In other words, the recessed section 145 can include tilted surfaces (side surfaces) tilted 45 degrees with respect to the horizontal direction of the surface of the base (the plate-like member) 140, for example. The number of the recessed sections 145 is, for example, four. For example, the light emitting element 100 is surrounded by the four side surfaces of the recessed section 145. The light emitting element 100 can be disposed so that the light is emitted in parallel to the horizontal direction of the surface of the base (the plate-like member) 140, for example.

The sub-mount 141 can directly support the light emitting element 100. As shown in FIGS. 2 through 4, the sub-mount 141 is formed on the bottom surface of the recessed section 145 of the base 140. On the sub-mount 141, there is formed the light emitting element 100. As the sub-mount 141, a plate-like member, for example, can be used. It should be noted that it is also possible that the base 140 directly supports the light emitting element 100 instead of providing the sub-mount 141, for example.

The thermal conductivity of the base 140 is, for example, higher than the thermal conductivity of the sub-mount 141, and the thermal conductivity of the sub-mount 141 is, for example, higher than the thermal conductivity of the light emitting element 100. The respective thermal conductivities of the base 140 and the sub-mount 141 are, for example, equal to or higher than 140 W/mK. The base 140 and the sub-mount 141 can each be made of, for example, Cu, Al, Mo, W, Si, C, Be, or Au, a compound (e.g., AlN, BeO) thereof, or an alloy (e.g., CuMo). Further, it is also possible to configure each of the base 140 and the sub-mount 141 from a combination of these citations such as a multilayer structure of a copper (Cu) layer and a molybdenum (Mo) layer.

The reflecting section 163 can be formed on the side surfaces of the recessed section 145 of the base 140. Since the reflecting section 163 is formed along the tilted side surfaces of the recessed section 145, the reflecting section 163 is also tilted. Among the surfaces of the reflecting section 163, the surface to which the first outgoing light L1 is input corresponds to the first reflecting surface 162, and the surface to which the second outgoing light L2 is input corresponds to the second reflecting surface 164. One of the two tilted surfaces to which the outgoing light beams L1, L2 are input can be provided with the first reflecting surface 162, and the other of the two tilted surfaces can be provided with the second reflecting surface 164. The reflecting section 163 can be made of, for example, Al, Ag, or Au. By providing the reflecting section 163, the reflectance of the reflecting surfaces 162, 164 can be improved. It should be noted that it is also possible to use the tilted side surfaces of the recessed section 145 of the base 140 as the first reflecting surface 162 and the second reflecting surface 164 without providing the reflecting section 163, for example.

As shown in FIGS. 2 and 4, the base 140 is provided with a through hole 147 having, for example, a columnar shape. Inside the through hole 147, there is disposed a columnar terminal 144 having a side surface covered with an insulating member 146, for example. The insulating member 146 is made of, for example, resin or ceramics (e.g., AlN). The terminal 144 is made of, for example, copper (Cu).

The terminal 144 is connected to the second electrode 120 of the light emitting element 100 via the first connection member 142 such as a bonding wire. The first connection member 142 is disposed so as not to block the light paths of the outgoing light beams L1, L2. Further, the first electrode 122 of the light emitting element 100 is connected to the sub-mount 141 via the second connection member 143 such as a plating bump. The sub-mount 141 is connected to the base 140. Therefore, by applying different potentials to the terminal 144 and the base 140, a voltage can be applied between the first electrode 122 and the second electrode 120.

As shown in, for example, FIG. 3, the lid 148 is disposed on the base 140. It is possible for the lid 148 to seal the recessed section 145 of the base 140 to thereby encapsulate the light emitting element 100 disposed inside the recessed section 145. The lid 148 is made of a material having permeability to the wavelengths of the reflected light L3, L4. Thus, at least a part of the first reflected light L3 can be transmitted through the lid 148, and at least a part of the second reflected light L4 can be transmitted through the lid 148. The lid 148 can be made of, for example, quartz, glass, crystal, or plastic. These materials can arbitrarily be selected in accordance with the wavelengths of the reflected light L3, L4. Thus, the absorption loss of the light can be reduced.

Although the case in which the light emitting element 100 is a type of InGaAlP is explained hereinabove as an example of the light emitting device 1000, any type of material with which the light emitting gain region can be formed can be used as the light emitting element 100. In the case of semiconductor materials, semiconductor materials such as an AlGaN type, an InGaN type, a GaAs type, an InGaAs type, a GaInNAs type, or a ZnCdSe type can be used.

The light emitting device 1000 has following features, for example.

In the light emitting device 1000, it is possible to reflect both of the two outgoing light beams L1, L2 emitted from the light emitting element 100 in a horizontal direction toward the upper side of the light emitting element 100. Thus, it becomes possible to simplify the configuration of the optical system (e.g., the equalizing optical systems 1002R, 1002G, and 1002B (see FIG. 1)) of the projector 10000 to thereby make the light axis adjustment easier in the projector 10000.

In the light emitting device 1000, both of the two outgoing light beams L1, L2 can be reflected toward the same direction. In other words, the proceeding direction of the first reflected light L3 obtained by the first reflecting surface 162 and the proceeding direction of the second reflected light L4 obtained by the second reflecting surface 164 can be made the same. Thus, it becomes possible to further simplify the configuration of the optical system of the projector 10000 to thereby make the light axis adjustment easier in the projector 10000.

In the light emitting device 1000, the reflecting surfaces 162, 164 are disposed integrally with the base 140. Thus, the light emitting device 1000 can be downsized.

In the light emitting device 1000, the reflectance of the two reflecting surfaces 162, 164 can be set higher than 50%. Thus, it becomes possible to efficiently use the outgoing light beams L1, L2 emitted from the both ends of the light emitting element 100.

In the light emitting device 1000, the thermal conductivity of the base 140 and the sub-mount 141 can be set higher than the thermal conductivity of the light emitting element 100. Thus, the base 140 and the sub-mount 141 can function as a heat sink. Therefore, it becomes possible to provide the light emitting device 1000 superior in heat radiation performance. Further, in the light emitting device 1000, the active layer 108 is disposed on the side of the base 140 in the light emitting element 100. Thus, it becomes possible to provide the light emitting device 1000 further superior in heat radiation performance.

In the light emitting device 1000, the light emitting element 100 can be encapsulated using the lid 148. Thus, improvement in reliability of the light emitting device 1000 can be achieved.

According to the light emitting device 1000, the laser oscillation of the light generated in the gain region 180 can be suppressed or prevented as described above. Therefore, the speckle noise can be reduced.

3. Method of Manufacturing Light Emitting Device

Then, an example of a method of manufacturing the light emitting device 1000 used in the projector 10000 according to the present embodiment will be explained with reference to the drawings. However, the invention is not limited to the example described below.

Figure 5:
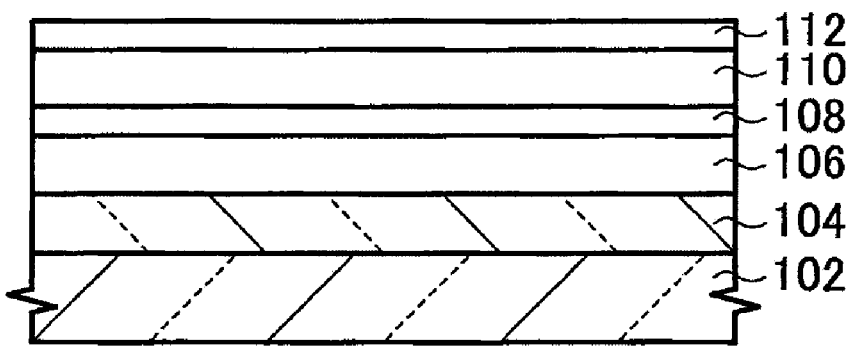
FIG. 5 is a cross-sectional view schematically showing a manufacturing process of the light emitting device of the projector according to the present embodiment.
Figure 6:
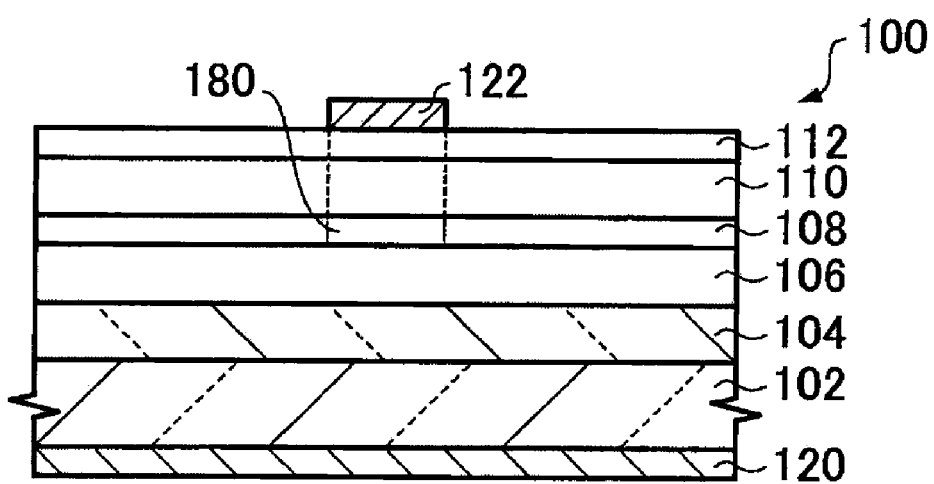
FIG. 6 is a cross-sectional view schematically showing the manufacturing process of the light emitting device of the projector according to the present embodiment.
Figure 7:
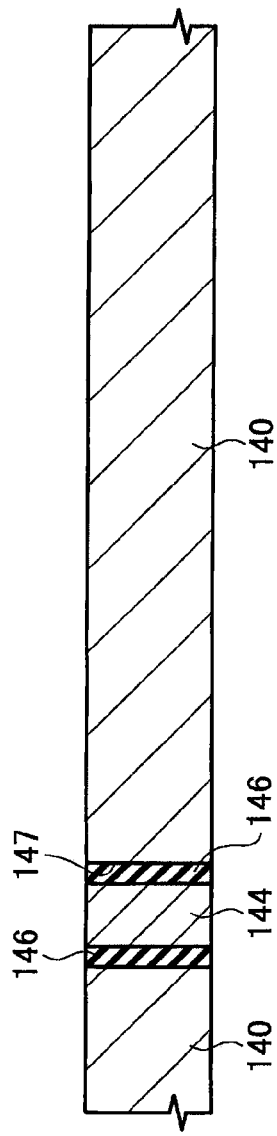
FIG. 7 is a cross-sectional view schematically showing a manufacturing process of a light emitting element of the projector according to the present embodiment.
Figure 8:
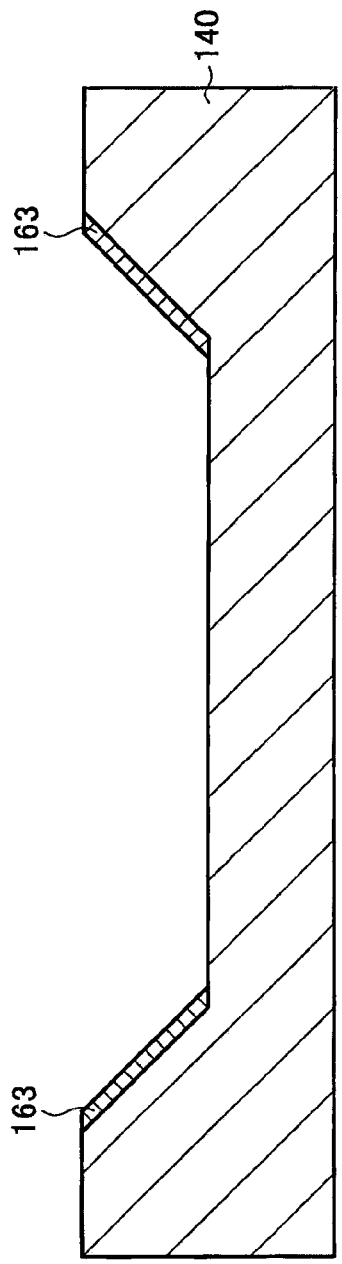
FIG. 8 is a cross-sectional view schematically showing a manufacturing process of a light emitting element of the projector according to the present embodiment.

FIGS. 5 through 8 are cross-sectional view schematically showing a manufacturing process of the light emitting device 1000, FIGS. 5 through 7 correspond to the cross-sectional view shown in FIG. 4, and FIG. 8 corresponds to the cross-sectional view shown in FIG. 3.

Firstly, as shown in FIG. 5, the buffer layer 104, the second cladding layer 106, the active layer 108, the first cladding layer 110, and the contact layer 112 are grown epitaxially on the substrate 102 in this order. As the method of growing the layers epitaxially, a metal-organic chemical vapor deposition (MOCVD) method, a molecular beam epitaxy (MBE) method can be used, for example.

Subsequently, as shown in FIG. 6, the first electrode 122 is formed on the contact layer 112. The first electrode 122 is formed by, for example, forming a conductive layer on the entire surface using a vacuum evaporation method, and then patterning the conductive layer using a photolithography technology and an etching technology. Further, the first electrode 122 can also be formed to have a desired shape using, for example, a combination of a vacuum evaporation method and a liftoff method.

Subsequently, as shown in FIG. 6, the second electrode 120 is formed on the entire lower surface of the substrate 102. The manufacturing method of the second electrode 120 is the same as, for example, what is shown as an example of the manufacturing method of the first electrode 122 described above. It should be noted that the order of forming the first electrode 122 and the second electrode 120 is not particularly limited.

According to the process described above, the light emitting element 100 can be obtained as shown in FIG. 6. Subsequently, the second connection member 143 can be formed on the first electrode 122 of the light emitting element 100 using, for example, a plating method.

Subsequently, the base 140 with a desired shape can be manufactured by, for example, metal molding. Subsequently, as shown in FIG. 7, the through hole 147 is provided to the base 140 using a method known to the public. Subsequently, the insulating member 146 is formed so as to cover the inner side surface of the through hole 147. The insulating member 146 is formed so as not to block the through hole 147. The insulating member 146 is formed as a film using, for example, a chemical vapor deposition (CVD) method. Subsequently, a rod-like terminal 144 is inserted into the insulating member 146. It should be noted that it is also possible to use a method of inserting the rod-like terminal 144 having the insulating member 146 formed on the periphery thereof into the through hole 147.

Subsequently, as shown in FIG. 8, the reflecting section 163 can be formed in a desired area of the base 140. The reflecting section 163 can be formed by, for example, covering other areas than the desired area with a mask such as a photoresist, and using a evaporation method thereon. It should be noted that the formation of the reflecting section 163 can be performed, for example, prior to formation of the through hole 147 described above.

Subsequently, the sub-mount 141 can be mounted on the base 140. Subsequently, as shown in FIG. 4, it is possible to mount the light emitting element 100 on the sub-mount 141 in a flip-chip manner with the light emitting element 100 flipped, namely while making the active layer 108 side of the light emitting element 100 face the base 140 (junction down). It should be noted that it is also possible to mount the sub-mount 141 to the base 140 after mounting the light emitting element 100 to the sub-mount 141.

Subsequently, as shown in FIG. 4, the terminal 144 and the second electrode 120 of the light emitting element 100 are connected to each other using the first connection member 142. The present process can be performed using, for example, wire bonding.

Subsequently, as shown in FIG. 3, the lid 148 is bonded or welded to the base 140 in, for example, nitrogen atmosphere. Thus, the light emitting element 100 can be encapsulated.

The light emitting device 1000 can be obtained through the process described above.

4. Modified Examples of Light Emitting Device

Then, modified examples of the light emitting device used in the projector according to the present embodiment will be explained. Hereinafter, in the light emitting device according to the modified example, members having the same functions as those of the constituents of the light emitting device 1000 will be denoted by the same reference symbols, and detailed explanation thereof will be omitted.

4-1. Light Emitting Device According to First Modified Example

Figure 9:
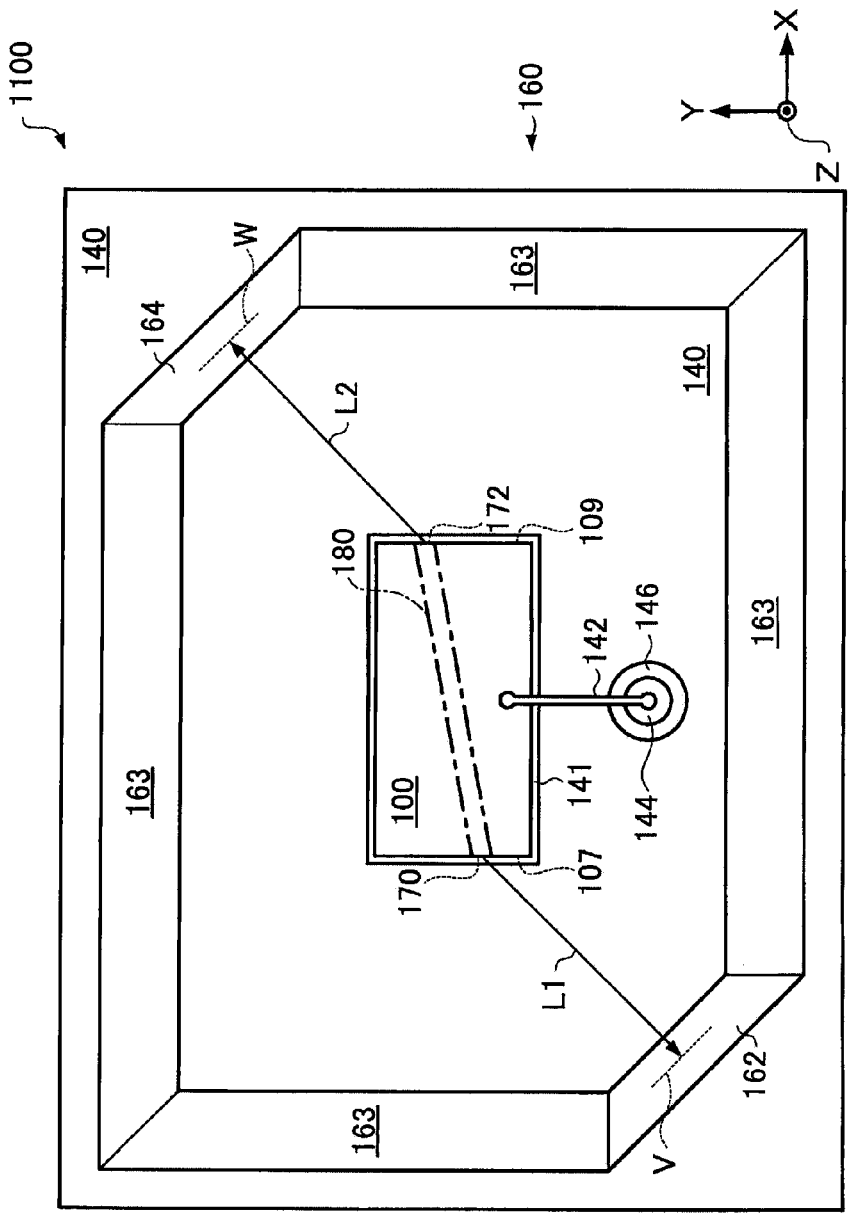
FIG. 9 is a plan view schematically showing a light emitting device according to a first modified example.

Firstly, a light emitting device 1100 according to the first modified example will be explained with reference to the accompanying drawings. FIG. 9 is a plan view schematically showing the light emitting device 1100.

In the example of the light emitting device 1000, there is explained the case in which the four side surfaces of the outer edge of the base 140 are not parallel to the respective four side surfaces of the outer edge of the light emitting element 100 as shown in FIG. 2. In contrast, in the present modified example, it is possible to make the four side surfaces of the outer edge of the base 140 parallel to the respective four side surfaces of the outer edge of the light emitting element 100 to thereby align the four side surfaces of the outer edge of the base 140 to the respective four side surfaces of the outer edge of the light emitting element 100 as shown in FIG. 9. In the example shown in the drawing, the number of tilted side surfaces of the recessed section of the base 140 is six, and the surfaces of the reflecting section 163 formed on the two of the six side surfaces correspond to the first reflecting surface 162 and the second reflecting surface 164. Also in the present modified example, for example, it is possible that the proceeding direction of the first outgoing light L1 makes a right angle with the nodal line V between the horizontal plane (the X-Y plane) and the first reflecting surface 162, and the proceeding direction of the second outgoing light L2 makes a right angle with the nodal line W between the horizontal plane and the second reflecting surface 164.

4-2. Light Emitting Device According to Second Modified Example

Figure 10:
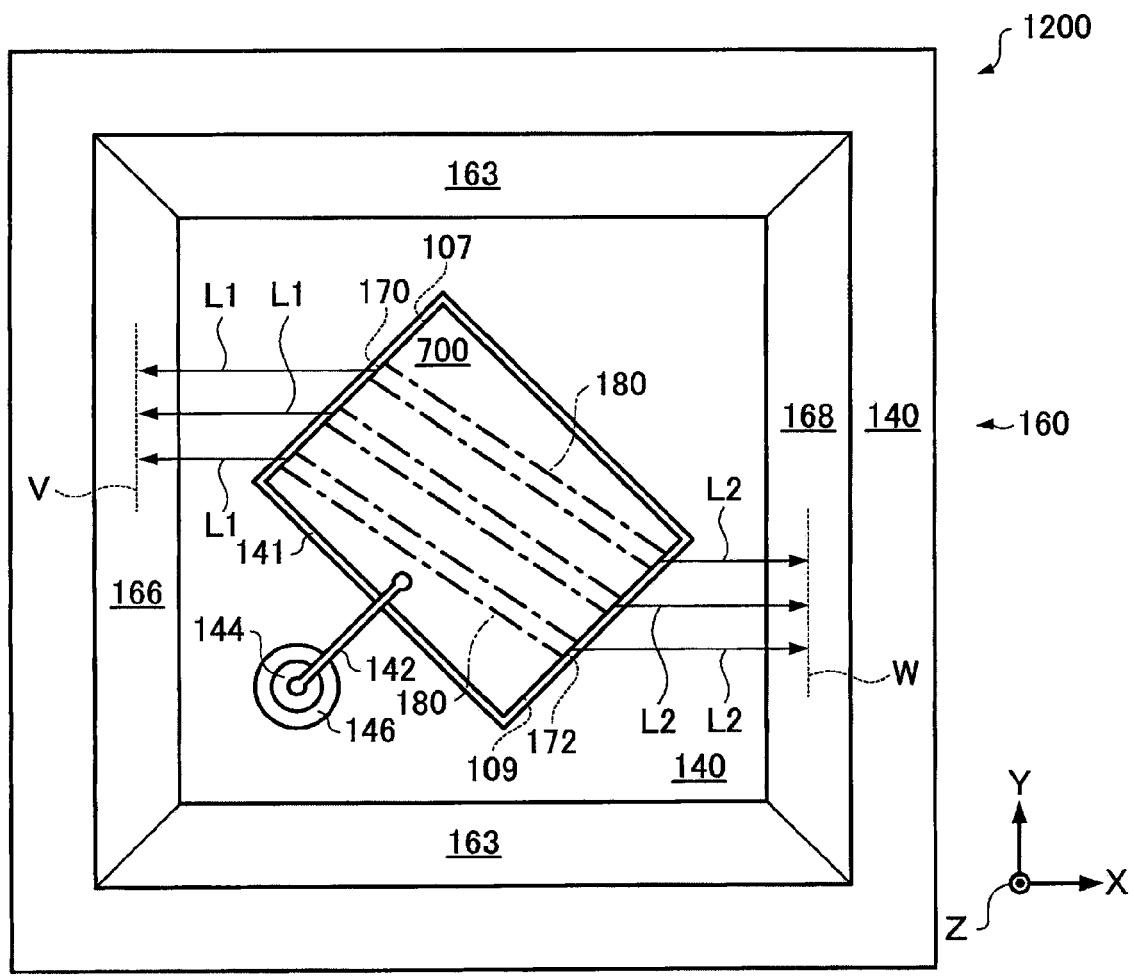
FIG. 10 is a plan view schematically showing a light emitting device according to a second modified example.
Figure 11:
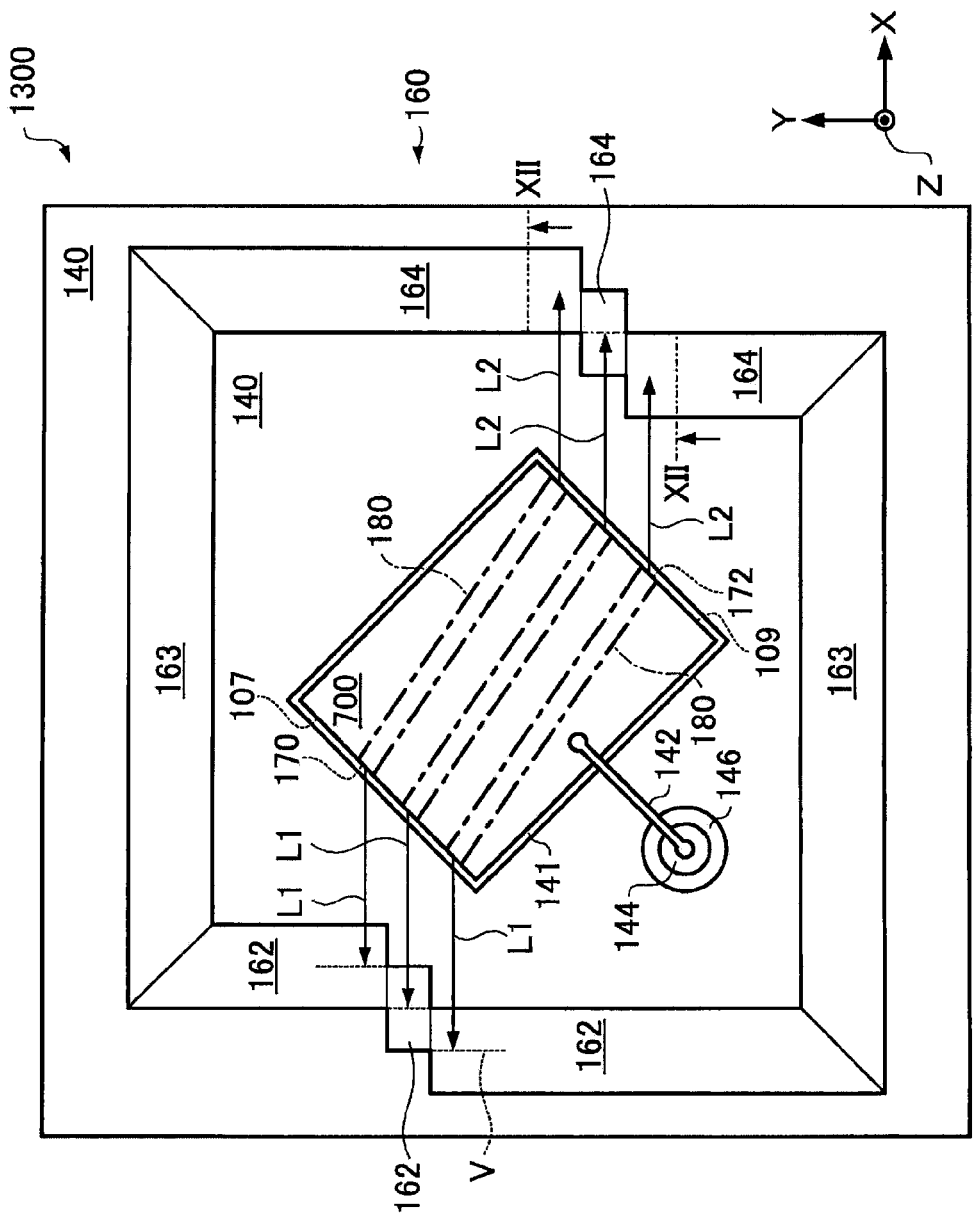
FIG. 11 is a plan view schematically showing the light emitting device according to the second modified example.

Then, light emitting devices 1200, 1300 according to a second modified example will be explained with reference to the accompanying drawings. FIG. 10 is a plan view schematically showing the light emitting device 1200. FIG. 11 is a plan view schematically showing another light emitting device 1300 according to the present modified example, and FIG. 12 is a cross-sectional view along the line XII-XII in FIG. 11.

In the example of the light emitting device 1000, the case in which a single gain region 180 is provided as shown in FIG. 2 is explained. In contrast, in the present modified example, a plurality (e.g., three in the example shown in the drawing) of gain regions 180 can be provided. In the present modified example, for example, as shown in FIG. 10, it is possible that the first reflecting surfaces (the surfaces for reflecting the first outgoing light beam L1) corresponding respectively to the first end surfaces 170 of the three gain regions 180 form a single plane 166 as a whole. Similarly, in the present modified example, for example, it is possible that the second reflecting surfaces (the surfaces for reflecting the second outgoing light beam L2) corresponding respectively to the second end surfaces 172 of the three gain regions 180 form a single plane 168 as a whole. In the example shown in FIG. 10, the lengths of the light paths of the three first outgoing light beams L1 from the first end surface 170 to the first reflecting surface (i.e., the plane 166) have values different from each other. For example, among the three first end surfaces 170, the closer to the plane 166 the first end surface 170 is, the shorter the length of the light path of the first outgoing light L1 emitted therefrom from the first end surface 170 to the surface 166 becomes. Further, in the example shown in the drawing, the same can be applied to the respective lengths of the light paths of the three second outgoing light beams L2 from the second end surfaces 172 to the second reflecting surface (i.e., the plane 168).

Figure 12:
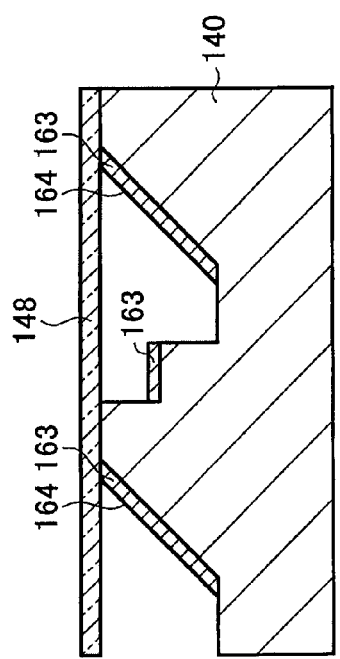
FIG. 12 is a cross-sectional view schematically showing the light emitting device according to the second modified example.

Further, in the present modified example, as shown in FIGS. 11 and 12, it is possible, for example, that the first reflecting surfaces 162 corresponding to the first end surfaces 170 of the three gain regions 180 are disposed at positions having the same lengths of the light paths of the first outgoing light beams L1 from the first end surfaces 170 to the first reflecting surfaces 162. Similarly, in the present modified example, it is possible, for example, that the second reflecting surfaces 164 corresponding to the second end surfaces 172 of the three gain regions 180 are disposed at positions having the same lengths of the light paths of the second outgoing light beams L2 from the second end surfaces 172 to the second reflecting surfaces 164. In the examples shown in FIGS. 11 and 12, unlike the example shown in FIG. 10, the three first reflecting surfaces 162 form separate planes instead of a single plane. Further, the same is applied to the three second reflecting surfaces 164 in the example shown in the drawing.

4-3. Light Emitting Device According to Third Modified Example

Figure 13:
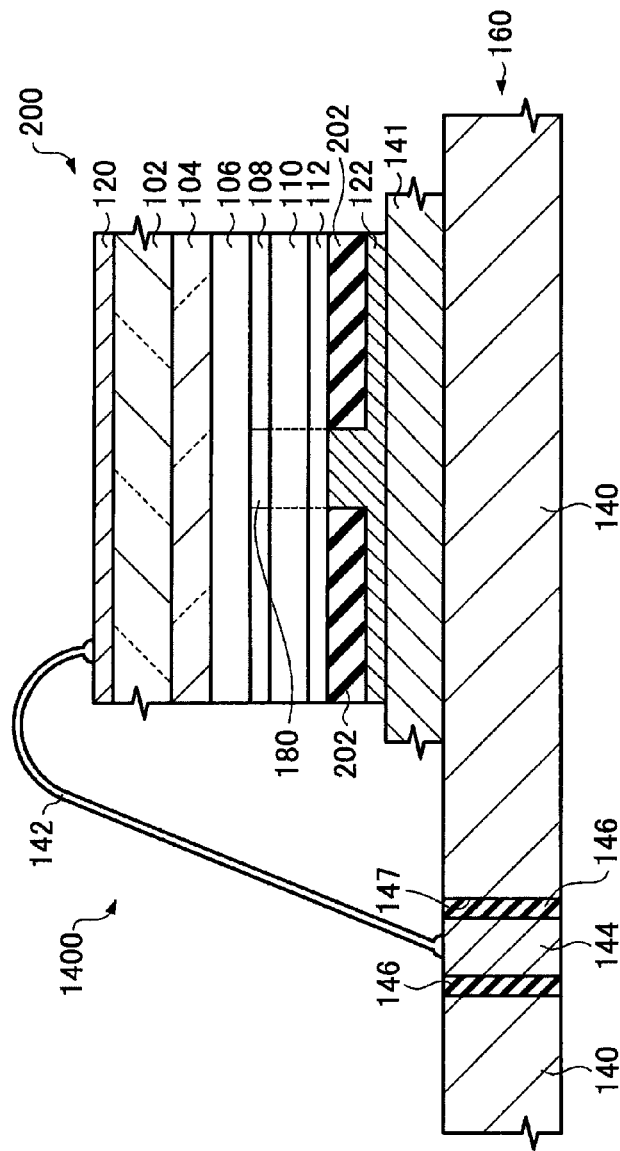
FIG. 13 is a cross-sectional view schematically showing a light emitting device according to a third modified example.

Then, a light emitting device 1400 according to a third modified example will be explained with reference to the accompanying drawings. FIG. 13 is a cross-sectional view schematically showing the light emitting device 1400 according to the present modified example. It should be noted that the cross-sectional view shown in FIG. 13 corresponds to the cross-sectional view shown in FIG. 4 in the example of the light emitting device 1000.

In the example of the light emitting device 1000, the case in which the first electrode 122 have the planar shape identical to that of the gain region 180 from the top to the bottom thereof is explained. In contrast thereto, in the example shown in FIG. 13, for example, the lower part of the first electrode 122 can be provided with a planar shape different from that of the gain region 180. In the present modified example, it is possible to form an insulating layer 202 having an opening section under the contact layer 112, and then form the first electrode 122 filling the opening section. The first electrode 122 is formed inside the opening section and under the insulating layer (including the opening section) 202. In the present modified example, the upper part of the first electrode 122 has the planar shape identical to that of the gain region 180, and the lower part of the first electrode 122 has the planar shape identical to that of the insulating layer 202. As the insulating layer 202, for example, an SiN layer, an $SiO_2$ layer, and a polyimide layer can be used. The insulating layer 202 is formed as a film using a CVD method or a coating method. The first electrode 122 is bonded directly to the sub-mount 141, for example. The bonding is performed using, for example, alloy bonding or bonding with solder paste.

According to the present modified example, since the volume of the lower part of the first electrode 122 can be increased compared to the example of the light emitting device 1000, it becomes possible to provide the light emitting device 1400 superior in heat radiation performance.

4-4. Light Emitting Device According to Fourth Modified Example

Figure 14:
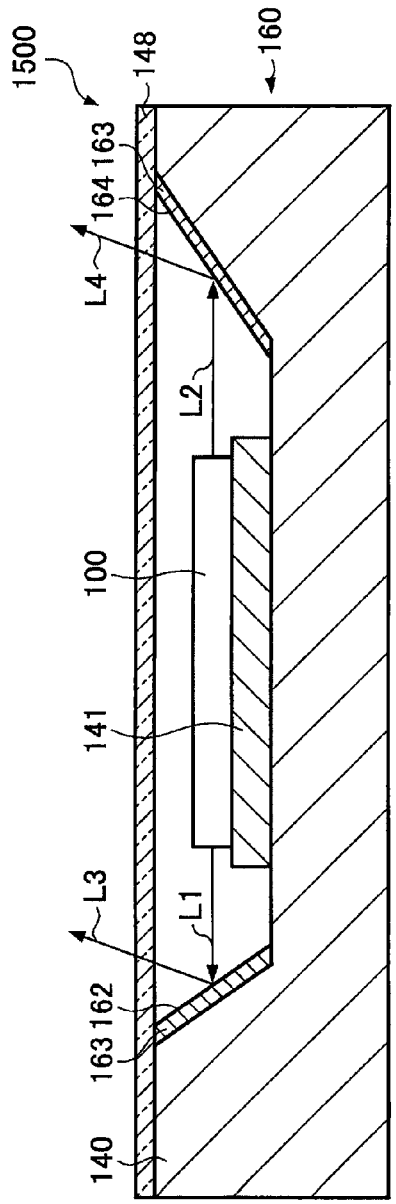
FIG. 14 is a cross-sectional view schematically showing a light emitting device according to a fourth modified example.
Figure 15:
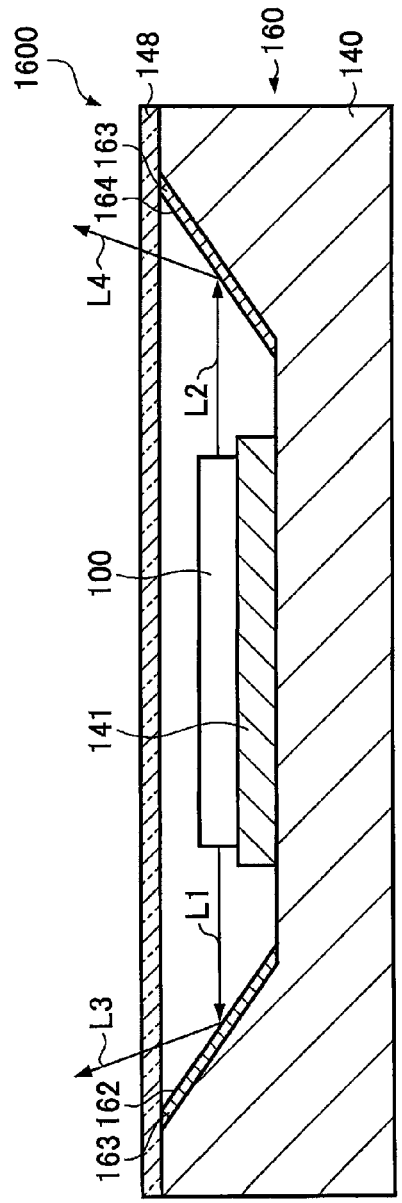
FIG. 15 is a cross-sectional view schematically showing the light emitting device according to the fourth modified example.

Then, light emitting devices 1500, 1600 according to a fourth modified example will be explained with reference to the accompanying drawings. FIG. 14 is a cross-sectional view schematically showing the light emitting device 1500. FIG. 15 is a cross-sectional view schematically showing another light emitting device 1600 according to the present modified example. It should be noted that the cross-sectional views shown in FIGS. 14 and 15 correspond to the cross-sectional view shown in FIG. 3 in the example of the light emitting device 1000.

In the example of the light emitting device 1000, the case in which the first reflected light L3 and the second reflected light L4 proceed upward in a direction perpendicular to the upper surface of the active layer 108 (the Z direction shown in FIG. 2) as shown in FIG. 3 is explained. In contrast thereto, in the present modified example, it is possible that at least one of the first reflected light L3 and the second reflected light L4 does not proceed upward in the direction perpendicular to the upper surface of the active layer 108. For example, as shown in FIG. 14, the first reflected light L3 and the second reflected light L4 can proceed in directions tilted toward the same side from the vertical direction (the Z direction shown in FIG. 2). In the example shown in FIG. 14, the proceeding direction of the first reflected light L3 and the proceeding direction of the second reflected light L4 are the same. Further, as shown in FIG. 15, for example, the first reflected light L3 can proceed in a direction tilted toward one side from the vertical direction, while the second reflected light L4 can proceed in a direction tilted toward the other side from the vertical direction. In the example shown in FIG. 15, the proceeding directions of the first reflected light L3 and the proceeding direction of the second reflected light L4 are diffusing directions. However, the directions can be conversing directions although not shown in the drawings. It should be noted that also in the present modified example the first reflected light L3 and the second reflected light L4 can proceed toward the upper side of the light emitting element 100. In the present modified example, the tilt angles of the first reflecting surface 162 and the second reflecting surface 164 are appropriately adjusted.

4-5. Light Emitting Device According to Fifth Modified Example

Figure 16:
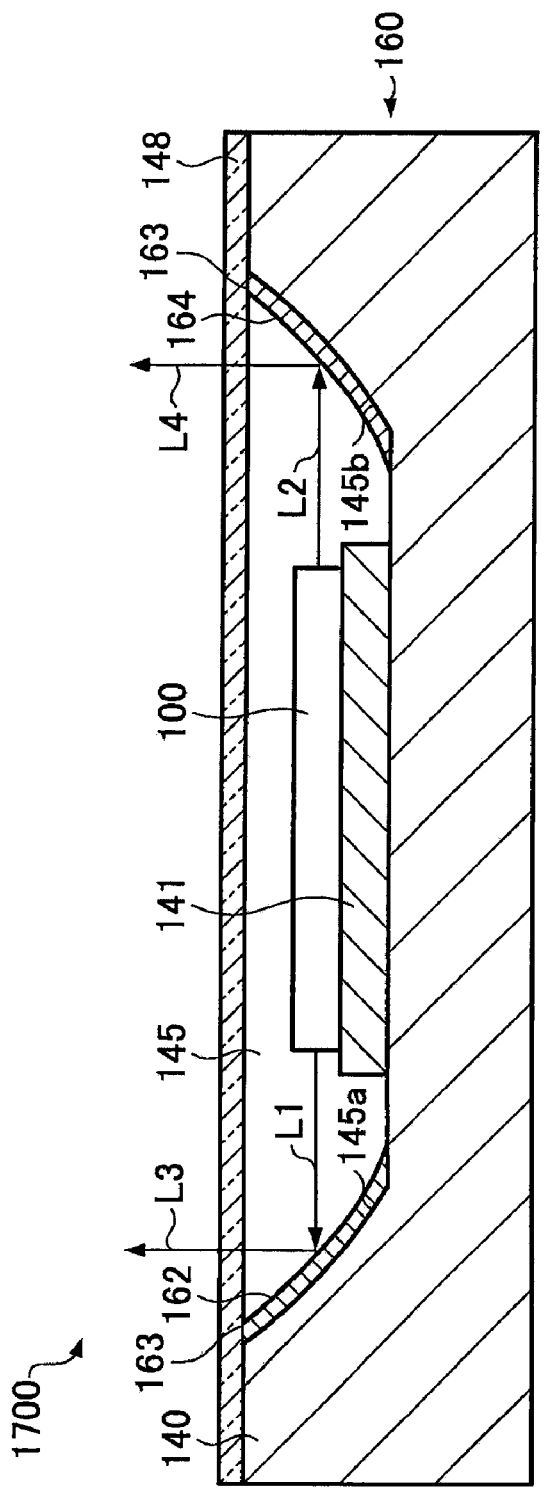
FIG. 16 is a cross-sectional view schematically showing a light emitting device according to a fifth modified example.

Then, a light emitting device 1700 according to a fifth modified example will be explained with reference to the accompanying drawings. FIG. 16 is a cross-sectional view schematically showing the light emitting device 1700. It should be noted that FIG. 16 corresponds to the cross-sectional view shown in FIG. 3 in the example of the light emitting device 1000.

In the example of the light emitting device 1000, the case in which the side surfaces of the recessed section 145 are tilted 45 degrees with respect to the horizontal direction as shown in FIG. 3 is explained. In contrast thereto, in the light emitting device 1700, the side surfaces of the recessed section 145 each can have a concave shape. For example, the two side surfaces (a first concave surface 145a, a second concave surface 145b) of the recessed section 145 provided with the reflecting surfaces 162, 164 each can have a concave shape. It can also be said that the recessed section 145 has the first concave surface 145a and the second concave surface 145b. The surface of the reflecting section 163 provided to the first concave surface 145a corresponds to the first reflecting surface 162, and the surface of the reflecting section 163 provided to the second concave surface 145b corresponds to the second reflecting surface 164. In other words, the first reflecting surface 162 and the second reflecting surface 164 can each be a concave mirror. Also in the light emitting device 1700, it is possible to reflect both of the two outgoing light beams L1, L2 emitted from the light emitting element 100 in a horizontal direction toward the upper side of the light emitting element 100. Further, both of the two outgoing light beams L1, L2 can be reflected toward the same direction.

The first concave surface 145a and the second concave surface 145b can each be, for example, a paraboloidal surface. In other words, the first reflecting surface 162 and the second reflecting surface 164 can each be a paraboloid mirror. Further, the first end surface 170 of the light emitting element 100 is disposed, for example, so as to be located at the focal point of the first concave surface 145a, and the second end surface 172 of the light emitting element 100 is disposed, for example, so as to be located at the focal point of the second concave surface 145b. Thus, it becomes possible to reflect both of the two outgoing light beams L1, L2, which are emitted from the light emitting element 100 in a horizontal direction, toward the same direction, and at the same time to convert them into parallel light beams. According to the light emitting device 1700, since the outgoing light beams L1, L2 with the large radiation angles can be converted into the parallel light beams, the light efficiency can be improved.

4-6. Light Emitting Device According to Sixth Modified Example

Figure 17:
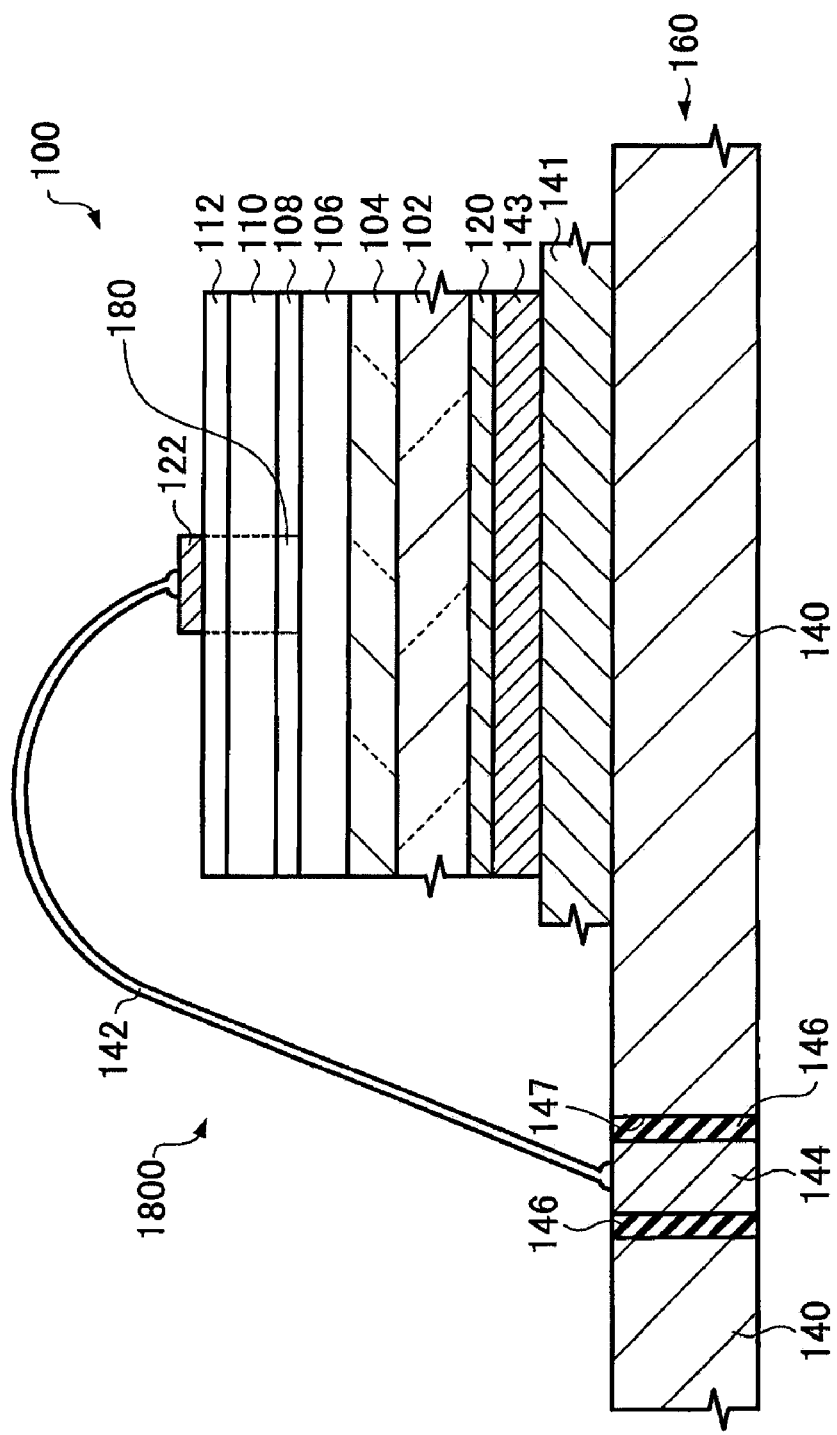
FIG. 17 is a cross-sectional view schematically showing a light emitting device according to a sixth modified example.

Then, a light emitting device 1800 according to a sixth modified example will be explained with reference to the accompanying drawings. FIG. 17 is a cross-sectional view schematically showing the light emitting device 1800. It should be noted that the cross-sectional view shown in FIG. 17 corresponds to the cross-sectional view shown in FIG. 4 in the example of the light emitting device 1000.

In the example of the light emitting device 1000, the active layer 108 is disposed on the side of the base 140 in the light emitting element 100 as shown in FIG. 4. In contrast thereto, in the light emitting device 1800, the active layer 108 is disposed on the side opposite to the base 140 in the light emitting element as shown in FIG. 17. In other words, the active layer 108 is disposed on the upper side from the midpoint of the stacked structure of the light emitting element 100 in the thickness direction. In the light emitting device 1800, the substrate 102 is disposed between the active layer 108 and the base 140. The second electrode 120 is connected to the sub-mount 141 with, for example, the second connection member 143. Further, the first electrode 122 is connected to the terminal 144 with, for example, the first connection member 142.

According to the light emitting device 1800, since the substrate 102 is disposed between the active layer 108 and the base 140, the active layer 108 is disposed at the position at least by the thickness of the substrate 102 further from the base 140 compared to the example of the light emitting device 1000. Therefore, the outgoing light with a much preferable shape (cross-sectional shape) can be obtained. If, for example, the radiation angle of the outgoing light from the gain region 180 is large, the outgoing light is blocked by the base 140, and in some cases, the shape of the outgoing light might be distorted in some cases. In the light emitting device 1800, such a problem can be avoided.

4-7. Light Emitting Device According to Seventh Modified Example

Figure 18:
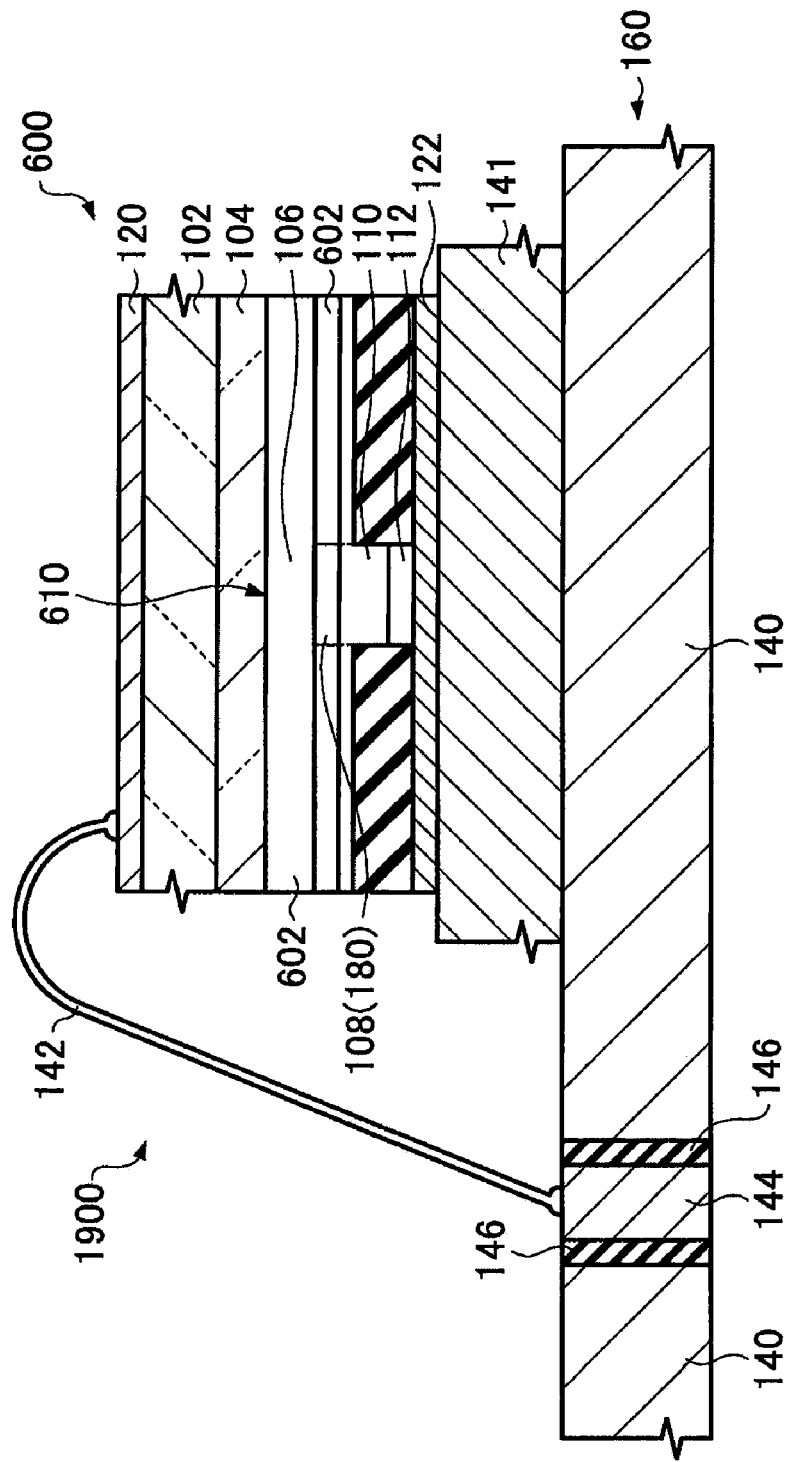
FIG. 18 is a cross-sectional view schematically showing a light emitting device according to a seventh modified example.

Then, a light emitting device 1900 according to a seventh modified example will be explained with reference to the accompanying drawings. FIG. 18 is a cross-sectional view schematically showing the light emitting device 1900. It should be noted that the cross-sectional view shown in FIG. 18 corresponds to the cross-sectional view shown in FIG. 4 in the example of the light emitting device 1000.

In the example of the light emitting device 1000, a so-called gain guide type is explained. In contrast thereto, the light emitting device 1900 can be a so-called refractive index guide type.

In other words, as shown in FIG. 18, in the light emitting device 1900, the contact layer 112 and a part of the first cladding layer 110 can constitute a columnar section 610. The planar shape of the columnar section 610 is the same as that of the gain region 180. The current channel between the electrodes 120, 122 is determined by the planar shape of the columnar section 610, for example, and as a result, the planar shape of the gain region 180 is determined. It should be noted that although not shown in the drawings, the columnar section 610 can be composed of, for example, the contact layer 112, the first cladding layer 110, and the active layer 108, or composed further including the second cladding layer 106. Further, the side surfaces of the columnar section 610 can also be tilted.

An insulating section 602 is disposed on the side of the columnar section 610. The insulating section 602 can have contact with the side surfaces of the columnar sections 610. As the insulating section 602, for example, an SiN layer, an $SiO_2$ layer, and a polyimide layer can be used. The insulating section 602 is formed as a film using a CVD method or a coating method. The current between the electrodes 120, 122 can flow through the columnar section 610 surrounded by the insulating section 602 while avoiding the insulating section 602. It is possible for the insulating section 602 to have a refractive index smaller than the refractive index of the active layer 108. Thus, in the horizontal direction (the direction perpendicular to the thickness direction of the active layer 108), it becomes possible to efficiently confine the light inside the gain region 180.

It should be noted that the embodiment and the modified examples described above are each nothing more than an example, and the invention is not limited thereto. For example, it is also possible to arbitrarily combine the embodiment and the modified examples described above.

As described above, although the embodiment of the invention is hereinabove explained in detail, it should easily be understood by those skilled in the art that various modifications not substantially departing from the novel matters and the advantages of the invention are possible. Therefore, such modified examples should be included in the scope of the invention.

The entire disclosure of Japanese Patent Application No. 2009-210579, filed Sep. 11, 2009 is expressly incorporated by reference herein.

What is claimed is:

1. A projector comprising:
a light emitting device;
a light modulation device adapted to modulate first and second light beams emitted from the light emitting device in accordance with image information; and
a projection device adapted to project a projection image formed by the light modulation device,
wherein the light emitting device includes
a light emitting element formed of a super luminescent diode in a rectangular shape, and adapted to emit the first and second light beams from first and second end surfaces, respectively, when flowing current through an active layer sandwiched between a first cladding layer and a second cladding layer, and
a base supporting the light emitting element, and provided with a first reflecting surface and a second reflecting surface each adapted to reflect the light emitted from the light emitting element, the first and second end surfaces respectively angled relative to the first and second reflecting surfaces,
a first emitting direction of the first light beam emitted from the first end surface of the light emitting element and a second emitting direction of the second light beam emitted from the second end surface of the light emitting element are opposite to each other, and the first and second emitting directions are angled relative to perpendicular directions of the first and second end surfaces, respectively,
the first reflecting surface reflects the first light beam,
the second reflecting surface reflects the second light beam, and a first reflecting direction of the first light beam reflected by the first reflecting surface and a second reflecting direction of the second light beam reflected by the second reflecting surface are the same as each other.

2. The projector according to claim 1, wherein
the base has a recessed section provided to a surface thereof,
the recessed section has at least first and second tilted surfaces tilted 45 degrees with respect to a horizontal direction of the surface of the base,
the light emitting element is disposed so that the first and second light beams are emitted in parallel to the horizontal direction of the surface of the base,
the first tilted surface is provided with the first reflecting surface, and
the second tilted surface is provided with the second reflecting surface.

3. The projector according to claim 1, wherein
the base has a recessed section provided to a surface thereof,
the recessed section has a first concave surface and a second concave surface each having a concave shape,
the first concave surface is provided with the first reflecting surface, and
the second concave surface is provided with the second reflecting surface.

4. The projector according to claim 3, wherein
the first concave surface and the second concave surface are each a paraboloidal surface,
the first end surface is located at a focal position of the first concave surface, and
the second end surface is located at a focal position of the second concave surface.

5. The projector according to claim 1, further comprising:
a lid made of a material permeable to the first and second light beams,
wherein the light emitting element is encapsulated with the lid.

6. The projector according to claim 1, wherein
a thermal conductivity of the base is higher than a thermal conductivity of the light emitting element.

7. The projector according to claim 1, wherein
the active layer is disposed on near the base in the light emitting element.

8. The projector according to claim 1, wherein
the active layer is disposed on a side opposite to the base in the light emitting element,
the light emitting element further includes a substrate provided with the active layer sandwiched between the first cladding layer and the second cladding layer, and
the substrate is disposed between the active layer and the base.

\* \* \* \* \*